United States Patent [19]

Frederiksen et al.

[11] 3,723,830

[45] Mar. 27, 1973

[54] LOW CURRENT, NOW NOISE AVALANCHE DIODE

[75] Inventors: Thomas M. Frederiksen, Scottsdale; Ernest L. Long, Tempe, both of Ariz.

[73] Assignee: Motorola, Inc., Franklin Park, Ill.

[22] Filed: Oct. 14, 1970

[21] Appl. No.: 80,619

[52] U.S. Cl.......317/234 R, 317/235 T, 317/235 AM

[51] Int. Cl...................................................H01l 9/00

[58] Field of Search.....................317/235 T, 235 AM

[56] References Cited

UNITED STATES PATENTS 3,403,306 9/1968 Haitz et al. ............................317/235

*Primary Examiner*—Martin H. Edlow

*Attorney*—Mueller and Aichele

[57] ABSTRACT

A low current, low noise avalanche diode is disclosed which can be provided on a semiconductor chip, in which a region of highly doped material of one conductivity type is produced in an epitaxial layer of material which is less highly doped and is of the same conductivity type, and at least one finger of such highly doped material extends from said highly doped region towards and makes a PN junction with a region of oppositely doped material. Contacts are applied to the two regions and act as the electrodes of the resultant diode.

8 Claims, 4 Drawing Figures

Patented March 27, 1973 3,723,830

INVENTOR.

*Thomas M. Frederiksen*

BY *Ernest L. Long*

*Mueller & Aichele*

*ATTY'S.*

LOW CURRENT, NOW NOISE AVALANCHE DIODE

BACKGROUND

Avalanche diodes, also known as zener diodes, are known which are adapted to be provided on a semiconductor chip. Such known zener diodes when operated with relatively low current passing through the PN junction thereof, are noisy, thereby causing noise in any circuit to which they are connected or of which they are a part, whereby use of such zener diodes is undesirable, and in fact, may be precluded in low noise circuits which are deposited on a chip or which are a part of an integrated circuit including such a diode.

It is an object of this invention to provide a low current avalanche diode which can be deposited on a chip, that is, be part of an integrated circuit, in which the noise produced by the diode is greatly reduced.

It is another object of this invention to provide a low current, low noise avalanche diode which may be provided on a chip or as part of an integrated circuit.

SUMMARY

In accordance with this invention, an epitaxial layer is deposited on a substrate, the layer being doped with impurities of a first conductivity type. A region of the layer which is more highly doped with impurities of the same conductivity type and a separate region of the layer which is doped with material of the other conductivity type, are provided in the epitaxial layer, the two regions being shallower than the epitaxial layer. However, the region of the opposite conductivity type may be deeper than the first mentioned regions. A finger or fingers of the first mentioned regions extend towards the second mentioned region and overlap a portion thereof and provide a PN junction therewith. The very small area of the PN junction increases the concentration of current flow in the PN junction to the extent that the so produced diode operates as a noiseless or as a reduced noise, low current, avalanche diode. However, the first and second regions are large enough so that connections may be made to the two regions, as by applying metallic electrodes thereto. If desired, a guard rail of material of the second conductivity type may be provided for the low noise diode. In a modification, the finger or fingers extend from the first region into the guard rail ring and form the PN junction therewith, whereby the second region is not required. In a modified structure, the conductive connections are provided, one on the first region and the other on the guard ring and near or partially surrounding the PN junction.

DESCRIPTION

Figure 1:
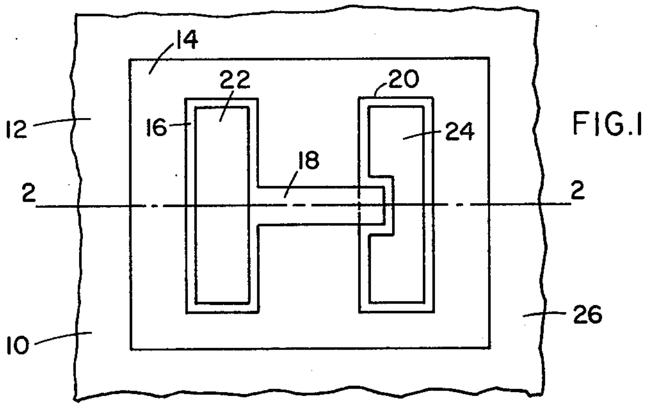
Figure 2:
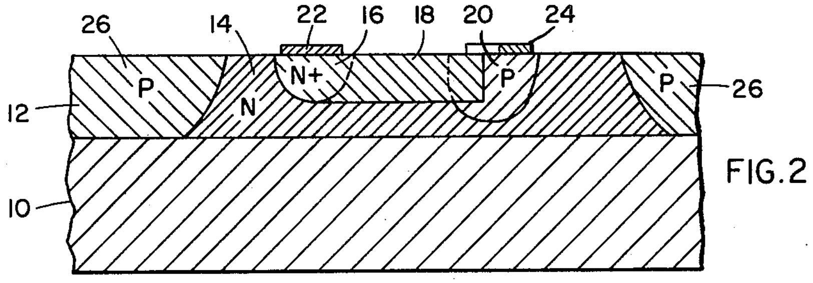
Figure 3:
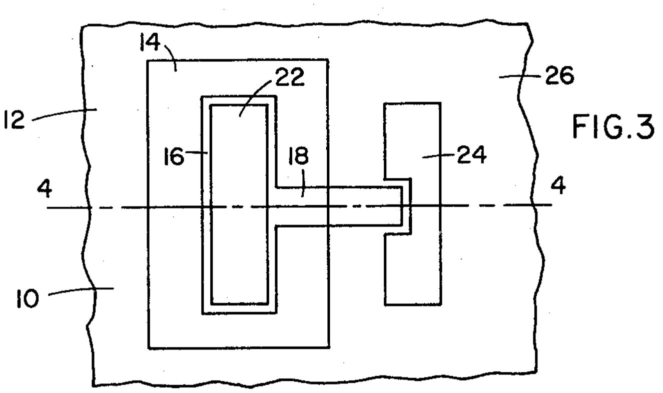
Figure 4:
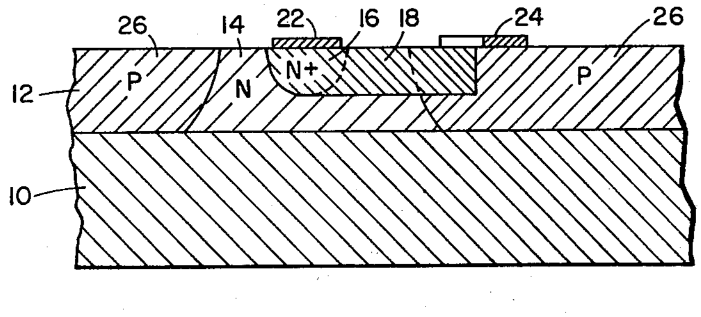

The invention will be better understood upon reading the following description in connection with the accompanying drawing in which FIGS. 1 and 3 illustrate two different embodiments of the low current, low noise avalanche diode of this invention and FIGS. 2 and 4 are sections of FIGS. 1 and 3 on lines 2—2 and 4—4, respectively thereof.

Turning first to FIGS. 1 and 2, a substrate 10 is provided on which an epitaxial layer 12 is deposited in a known manner. A portion 14 of the layer 12 is made to be a semiconductor of the N type. A region 16 of N+ material is provided in the portion 14, this region 16 being thinner than the portion 14 and having a thickness of about 2 microns. An N+ finger 18, which also has a thickness of about 2 microns, extends from one side of the region 16. A second region 20 of P material, which is thicker than the portion 16 and is about 2.7 microns thick, is provided in the portion 14 and is separated from the region 16. The N+ finger 18, however, extends at least partially over the P region 20 and forms the small PN junction therewith. A metallic contact 22 may be deposited on the region 16 and another metallic contact 24 may be deposited on the region 20. The contact 24 is notched as shown to clear the N+ finger 18. With the described construction, the PN junction is very small, whereby the current density therein is high enough to greatly reduce the noise produced by the diode when acting in an avalanche mode, yet the surface areas of the regions 16 and 18 are large so that contacts 22 and 24 thereon can be large enough so the connections may be readily made thereto. A P type guard rail portion or ring 26 of the layer 12 may be provided around the end portion 14.

In a modification of the diode of FIG. 1, as shown in FIGS. 3 and 4, the P area 20 is omitted and the finger 18 extends from the N portion into the P guard portion 26, the contact 24 being placed on the P guard portion 26 partially surrounding but insulated from the finger 18. Otherwise, the diode of FIGS. 3 and 4 is the same as the diode of FIGS. 1 and 2, and similar reference characters have been applied to similar elements of the several Figures. Again, the electrodes 22 and 24 are of practical size and the PN junction, between the finger 18 and the guard portion 26 in FIG. 2 is very small, increasing the PN junction current density of the low current, low noise avalanche diode of FIG. 2 to sufficiently great value to greatly reduce the noise produced by this diode when acting as an avalanche diode.

While the finger 18 extends from the N+ region 16 to the P region 20, the finger 18 may extend from the P region 20 through and overlay the N+ region 16. Or, more than one finger 18 may be provided, each forming a PN junction with the regions 16 or 20 and extending from the other regions 20 or 16, providing more than one small PN junction, if more current is necessary than can properly be passed through one small PN junction. Another way this device may be constructed is by providing an N+ region such as 16 having a finger such as 18 and a P region such as 20 having, however, a finger (not shown), the two fingers intersecting to provide the diode. While the portion 14 has been described as of N type semiconductor, the region 16 and the finger 18 as N+ semiconductor and the region 20 and the portion 26 as P type semiconductor, the opposite may be the case. That is, the portion 14 may be P, the region 16 and the finger 18 may be P+ and the region 20 and the portion 26 may be N.

As shown, the finger 18 ends before it completely crosses the region 20. It is found that such ending of the finger 18 contributes to the reduction in noise but the reason at present is not understood.

What is claimed is:

1. A monolithic integrated low current, low noise avalanche diode comprising:

a semiconductor substrate having at least one surface, an epitaxial layer of a semiconductor including impurities of one of P and N conductivity types, having a predetermined thickness, and overlying the surface of said substrate, a first region of semiconductor of the same conductivity type as said layer and including a greater concentration of impurities of said one conductivity type than said layer and extending from the surface thereof into said layer to a thickness less than said predetermined thickness, a second region of the opposite conductivity type extending from the surface of said epitaxial layer into said layer and separated from said first region by at least a part of said layer, a finger of semiconductive material having a thickness less than said predetermined thickness extending in said layer from and of the same conductivity type as one of said first region and said second region, and overlapping the other of said regions, and forming a PN junction therewith, said first and second regions being substantially greater in area on the surface of said epitaxial layer than the area of said PN junction and both being exposed on the same side of said epitaxial layer; and electrical contact means on said first and second regions on said same side of said epitaxial layer.

2. The invention of claim 1 in which said finger contains the same type and the same concentration of impurities as said first mentioned region and is integral therewith.

3. The invention of claim 2 in which a portion of said opposite conductivity type is provided in said epitaxial layer, spaced from and surrounding said regions.

4. The invention of claim 1 in which electrodes are applied to said region and to said material for making electrical contact thereto.

5. The invention of claim 1 in which said one conductivity type is N.

6. The invention of claim 1 in which said first conductivity type is N.

7. The invention of claim 1 in which said electrical contact means are electrodes applied to said first and second regions for making electrical contact thereto.

8. The invention of claim 1 in which said PN junction overlaps only partially said other of said regions.

* * * * *

UNITED STATES PATENT OFFICE
CERTIFICATE OF CORRECTION

Patent No. 3,723,830 Dated March 27, 1973

Inventor(s) Thomas M. Frederiksen et al.

It is certified that error appears in the above-identified patent and that said Letters Patent are hereby corrected as shown below:

Title of invention "LOW CURRENT, NOW NOISE AVALANCHE DIODE"

hould read -- LOW CURRENT, LOW NOISE AVALANCHE DIODE --.

Signed and sealed this 29th day of January 1974.

(SEAL)
ttest:

DWARD M.FLETCHER,JR.
ttesting Officer

RENE D. TEGTMEYER
Acting Commissioner of Patents